United States Patent
Shimizu

(10) Patent No.: US 12,423,801 B2
(45) Date of Patent: Sep. 23, 2025

(54) SUBSTRATE TREATING APPARATUS, SUBSTRATE TREATING SYSTEM, AND SUBSTRATE TREATING METHOD

(71) Applicant: SCREEN Holdings Co., Ltd., Kyoto (JP)

(72) Inventor: Shinji Shimizu, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 307 days.

(21) Appl. No.: 18/171,135

(22) Filed: Feb. 17, 2023

(65) Prior Publication Data

US 2023/0267603 A1  Aug. 24, 2023

(30) Foreign Application Priority Data

Feb. 22, 2022  (JP) .................................. 2022-025799

(51) Int. Cl.
  *G06T 7/00* (2017.01)
  *B05B 12/12* (2006.01)
  (Continued)

(52) U.S. Cl.
  CPC ............ *G06T 7/001* (2013.01); *B05B 12/122* (2013.01); *B05D 1/002* (2013.01); *B08B 3/04* (2013.01); *G06T 2207/30148* (2013.01)

(58) Field of Classification Search
  CPC ........... G06T 7/001; G06T 2207/30148; B05B 12/122; B05B 12/004; B05B 12/087;
  (Continued)

(56) References Cited

U.S. PATENT DOCUMENTS

2013/0236088 A1  9/2013  Umehara et al. ............. 382/149
2017/0028426 A1  2/2017  Kakuma
              (Continued)

FOREIGN PATENT DOCUMENTS

JP     2013051282 A    3/2013
JP     2013214279 A    10/2013
              (Continued)

OTHER PUBLICATIONS

Extended European Search Report dated Jun. 16, 2023 in corresponding European Patent Application No. 23156972.4.
              (Continued)

*Primary Examiner* — Samir A Ahmed
(74) *Attorney, Agent, or Firm* — OSTROLENK FABER LLP

(57) ABSTRACT

Disclosed is a substrate treating apparatus for performing a predetermined treatment on a substrate. The apparatus includes: a recipe memory unit configured to store a recipe; an imaging unit provided at a predetermined location and configured to image the component as a real image at work; a normal image memory unit configured to simulate a condition in advance where the component normally operates in response to the recipe and store in advance a normal image at this time in a view from the location in accordance with three-dimensional design information of the substrate treating apparatus; an operation controller configured to cause the predetermined treatment to be performed; and an abnormality detecting unit configured to detect an abnormality in accordance with a difference between the normal image synchronized with operation of the recipe and the real image.

15 Claims, 10 Drawing Sheets

(51) Int. Cl.
  *B05D 1/00*   (2006.01)
  *B08B 3/04*   (2006.01)
(58) Field of Classification Search
  CPC ......... B05B 12/12; B05B 15/70; B05D 1/002;
       B08B 3/04; Y02P 90/02; H01L 21/67276;
       H01L 21/67288; H01L 21/67259; H01L
       21/67011; H01L 21/67017; H01L
       21/67242; H01L 22/10; H01L 21/67051;
       H01L 21/6715; G06F 30/10
  See application file for complete search history.

(56) References Cited

U.S. PATENT DOCUMENTS

| | | | |
|---|---|---|---|
| 2018/0053319 A1* | 2/2018 | Kakuma | ........... H01L 21/67259 |
| 2019/0339684 A1 | 11/2019 | Cella et al. | |
| 2021/0210366 A1* | 7/2021 | Watanabe | ............... H01L 22/20 |
| 2022/0319893 A1* | 10/2022 | Maki | ........................ H01L 22/34 |

FOREIGN PATENT DOCUMENTS

| | | | | |
|---|---|---|---|---|
| JP | 2017011159 A | * | 1/2017 | |
| KR | 10-2021-0030447 A | | 3/2021 | |
| KR | 10-2021-0054557 A | | 5/2021 | |
| TW | 201710673 A | | 3/2017 | |
| TW | I615204 B | | 2/2018 | |
| TW | 202023693 A | | 7/2020 | |
| WO | WO-2020039762 A1 | * | 2/2020 | ......... B05C 11/1005 |
| WO | WO 2020/044884 A1 | | 3/2020 | |

OTHER PUBLICATIONS

Office Action dated Aug. 28, 2024 for corresponding Korean Patent Application No. KR 10-2023-0022094 and its English translation.
Office Action dated Oct. 25, 2023 for corresponding Taiwan Patent Application No. 112106026.

* cited by examiner

Fig. 4

| Process | Processing Content |
|---|---|
| 1 | Prepare Treatment Liquid Processing (Guard Movement) |
| 2 | Prepare Treatment Liquid Processing (Nozzle Movement) |
| 3 | Start Treatment Liquid Processing |
| ... | ... |
| 6 | Complete Treatment Liquid Treatment |
| 7 | Start Regular Rinse Treatment |
| ... | ... |
| 10 | Complete Regular Rinse Treatment |
| 11 | Start Rinse Treatment |
| ... | ... |
| 14 | Complete Rinse Treatment |
| 15 | Start Dry Processing |
| ... | ... |
| 18 | Finish Dry Processing |
| 19 | Finish Recipe Processing |

SUBSTRATE TREATING APPARATUS, SUBSTRATE TREATING SYSTEM, AND SUBSTRATE TREATING METHOD

BACKGROUND OF THE INVENTION

1. Field of the Invention

The present invention relates to a substrate treating apparatus, a substrate treating system, and a substrate treating method for performing a predetermined treatment on a substrate, such as a semiconductor substrate, a substrate for flat panel display (FPD) like liquid crystal display and organic electroluminescence (EL) display, a glass substrate for photomask, and an optical disk substrate. Particularly, the present invention relates to a technique for detecting an operational status of a component.

2. Description of the Related Art

Examples of a currently-used first apparatus of this type includes one including a memory unit, an image capturing unit, an abnormality detecting unit, and a display unit. See, for example, Japanese Unexamined Patent Publication No. 2013-214279.

The memory unit stores in advance normal video data indicating a normal processing state in the apparatus. The imaging unit obtains video data while the apparatus operates actually. The abnormality detecting unit calculates a degree of abnormality in accordance with the video data and the normal video data. The display unit displays the degree of abnormality in association with the video data. With the first apparatus, an abnormality can easily be detected while the apparatus that actually performs treatment to a substrate is at work.

Moreover, examples of a currently-used second apparatus of this type includes one including a generating unit, an extracting unit, and a video image generating unit. See, for example, Japanese Unexamined Patent Publication No. 2013-51282.

The generating unit generates detection operation data of a component from history information of operation regarding the component that forms the apparatus. The extracting unit extracts a shape of the component or design operation data from CAD data. The video image generating unit generates a video image that simulates design operation, which is operation during design, and detection operation, which is real operation at work, in accordance with the design operation data and the detection operation data. With the second apparatus, the video image that simulates the operation during designing and the real operation at work is displayed in such a form that both operations can be contrasted. Accordingly, after some inconvenience occurs at work, a cause of the inconvenience can be easily identified after work.

However, the example of the currently-used apparatus with such a construction has the following problems.
That is, the currently-used first apparatus cannot calculate a degree of abnormality correctly when the normal video data is different from the video data at work in imaging condition. Accordingly, such a drawback is present that the abnormality cannot be detected accurately.

Moreover, the second apparatus specifies a cause of the abnormality after the abnormality occurs at work by comparison with and observation of the video images. Accordingly, the second apparatus is effective in investigating the cause after the occurrence of the abnormality, but the second apparatus cannot detect the abnormality when the apparatus is at work. Consequently, improper treatment to the substrate may be performed continuously.

SUMMARY OF THE INVENTION

The present invention has been made regarding the state of the art noted above, and its object is to provide a substrate treating apparatus, a substrate treating system, and a substrate treating method that can detect an abnormality accurately at work by synchronizing an image based on design information with a recipe and using the image.

The present invention is constituted as stated below to achieve the above object.

One aspect of the present invention provides a substrate treating apparatus for performing predetermined treatment to a substrate, the substrate treating apparatus including: a recipe memory unit configured to store a recipe, specifying operation details and an execution order of a component that forms the substrate treating apparatus, to perform the predetermined treatment; an imaging unit provided at a predetermined location and configured to image the component as a real image at work; a normal image memory unit configured to simulate a condition in advance where the component normally operates in response to the recipe and store in advance a normal image at this time in a view from the location of the imaging unit in accordance with three-dimensional design information of the substrate treating apparatus; an operation controller configured to control the component in response to the recipe to perform the predetermined treatment; and an abnormality detecting unit configured to detect an abnormality in accordance with a difference between the normal image synchronized with operation of the recipe and the real image at work when the operation controller actually treats the substrate in response to the recipe.

According to the aspect of the present invention, the abnormality detecting unit detects an abnormality in accordance with the difference between the normal image synchronized with operation of the recipe and the real image at work when the operation controller actually treats the substrate in response to the recipe. The normal image is an image obtained by simulating a condition in advance where the component normally operates in response to the recipe and storing in advance the normal image at this time in the view from the location of the imaging unit in accordance with the three-dimensional design information of the substrate treating apparatus. Accordingly, since all the apparatus have the same imaging condition, an adverse effect due to difference in imaging condition can be avoided. Moreover, an image to be compared can be prevented from deviation since it is synchronized with the operation of the recipe. Accordingly, an abnormality can be detected accurately at work.

Moreover, it is preferred in the aspect of the present invention that the imaging unit captures the real image as a video image and the normal image memory unit stores the normal image as a video image.

Both the real image and the normal image are the video images, an abnormality can be easily detected between the image when the component moves and the image after the component moves. Moreover, this yields increase in number of target areas for abnormality detection.

Moreover, it is preferred in the aspect of the present invention that the abnormality detecting unit performs synchronization with reference to an arbitrary step among a plurality of steps constituting the recipe.

The abnormality detection is performable at any timing within the recipe. This yields easy setting of a desired abnormality detection position.

Moreover, it is preferred in the aspect of the present invention that the substrate treating apparatus further includes a spin chuck configured to support a substrate in a horizontal posture and rotate the substrate, a nozzle configured to eject a treatment liquid from its distal end to the substrate supported by the spin chuck, and a nozzle moving mechanism configured to move the distal end of the nozzle from an origin position laterally apart from the substrate and an ejecting position above the substrate, and that the abnormality detecting unit detects an abnormality about movement of the nozzle.

The abnormality detecting unit can detect an abnormality about the movement of the nozzle by the nozzle moving mechanism.

Moreover, it is preferred in the aspect of the present invention that the substrate treating apparatus further includes a spin chuck configured to support a substrate in a horizontal posture and rotate the substrate, and a fixed nozzle whose arrangement is fixed and configured to eject a treatment liquid from its distal end to the substrate supported by the spin chuck, and that the normal image memory unit includes, as the normal image, an image obtained by simulating a normal ejection condition of the treatment liquid from the fixed nozzle in view of the location by a fluid simulator.

The normal image contains an image simulated by the fluid simulator. Accordingly, an abnormality about ejection of the treatment liquid from the fixed nozzle can be detected.

Moreover, it is preferred in the aspect of the present invention that a substrate treating system includes a plurality of any type of the substrate treating apparatus described above.

The substrate treating system provided with the plurality of substrate treating apparatus can also detect an abnormality accurately at work.

Moreover, it is preferred in the aspect of the present invention that the substrate treating apparatus each include a score memory unit configured to store a score in accordance with the difference detected by the abnormality detecting unit, and further include a system controller configured to read out a score of the score memory unit and a display unit configured to display the score read out by the system controller.

The system controller reads out the score of the score memory unit in the substrate treating apparatus, and displays it on the display unit. This can easily understand a difference between the substrate treating apparatus having the same construction. Consequently, visualizing the difference in operation can contribute to reduction of the difference between the substrate treating apparatus.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 4 is a schematic view of details of a recipe as one example.

DESCRIPTION OF THE PREFERRED EMBODIMENTS

The following describes one embodiment of the present invention with reference to drawings.

1. Overall Configuration

Figure 1:
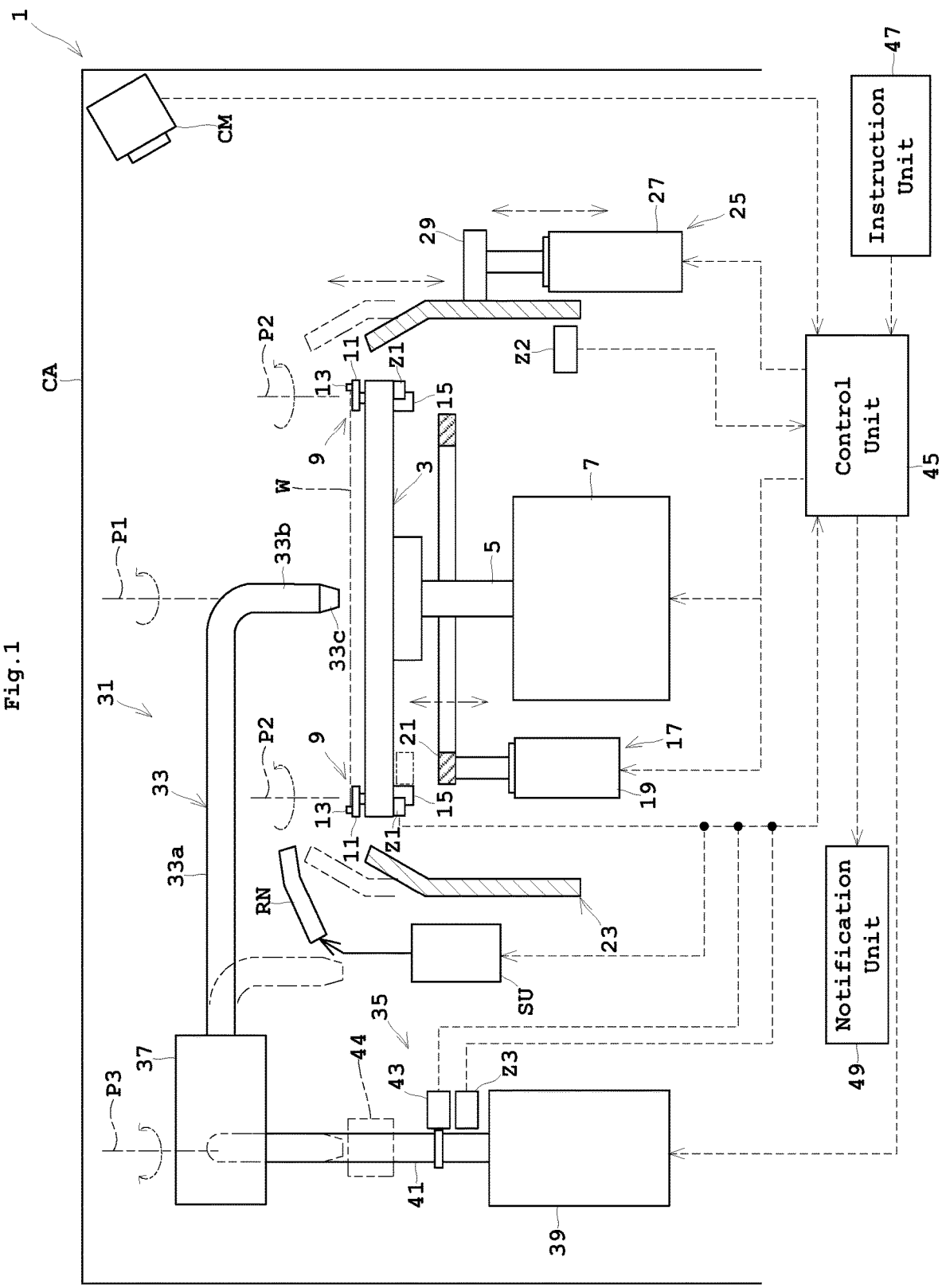
FIG. 1 is a side view of a substrate treating apparatus according to an embodiment.
Figure 2:
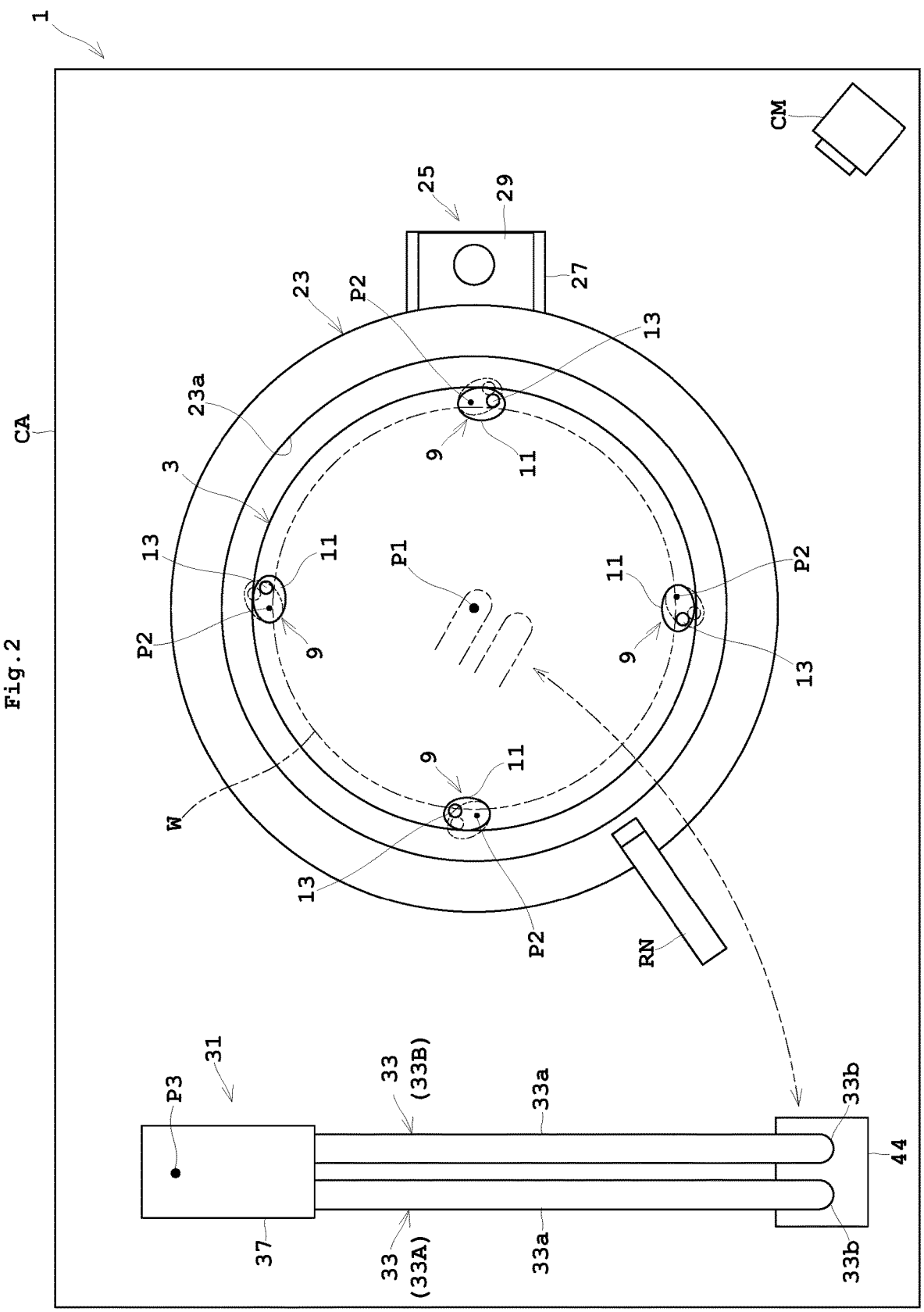
FIG. 2 is a plan view of the substrate treating apparatus according to the embodiment.

FIG. 1 is a side view of a substrate treating apparatus according to an embodiment. FIG. 2 is a plan view of the substrate treating apparatus according to the embodiment.

A substrate treating apparatus 1 is a single-wafer processing apparatus for treating substrates W one by one. The substrate W has a circular shape in plan view, for example. The substrate treating apparatus 1 performs predetermined treatment on the substrate W by supplying a treatment liquid while rotating the substrate W.

The substrate treating apparatus 1 includes a casing CA. The casing CA blocks the interior thereof from the surrounding atmosphere. The substrate treating apparatus 1 includes a spin chuck 3. The spin chuck 3 has a circular shape whose diameter is larger than a diameter of the substrate W in plan view. The spin chuck 3 includes a lower face connected to an upper end of a rotary shaft 5. A lower end of the rotary shaft 5 is connected to a motor 7. When the motor 7 is driven, the spin chuck 3 rotates around a rotation center P1. The rotation center P1 extends in a vertical direction.

The spin chuck 3 includes a plurality of chucks 9. The spin chuck 3 includes the chucks 9 at a peripheral edge of an upper face thereof. In the present embodiment, the spin chuck 3 includes four chucks 9. The number of chucks 9 is not limited to four as long as the substrate W can rotate stably around the rotation center P1 while being supported in a horizontal posture.

The chucks 9 each include a back face supporting portion 11 and a periphery edge supporting portion 13. The back face supporting portion 11 contacts and supports a back face of the substrate W. It is preferred that the back face supporting portion 11 is formed so as to have a small contact area to the back face of the substrate W. This can reduce a degree of mutual contamination. The back face supporting portion 11 is attached to the upper face of the spin chuck 3 so as to rotate freely around a rotation center P2. The rotation center P2 extends in a vertical direction. The periphery edge supporting portion 13 is erected on an upper face of the back face supporting portion 11. It is preferred that the periphery edge supporting portion 13 is formed so as to have a height from the front face of the back face supporting portion 11 larger than a thickness of the substrate W. Such a construction can hold the periphery edge of the substrate W stably. The periphery edge supporting portion 13 is provided apart from the rotation center P2 toward an outer edge of the back face supporting portion 11 in plan view. In other words, the periphery edge supporting portion 13 is eccentric from the rotation center P2.

A rotating magnet 15 is attached to the lower face of the spin chuck 3 at a position corresponding to the rotation center P2. The rotating magnet 15 is connected to the back face supporting portion 11. The rotating magnet 15 is provided so as to rotate freely around the rotation center P2. A chuck drive mechanism 17 is located below the rotating magnet 15.

The chuck drive mechanism 17 is located more adjacent to the rotary shaft 5 than the chucks 9. The chuck drive mechanism 17 includes an air cylinder 19 and a driving magnet 21, for example. The driving magnet 21 has an annular shape in plan view. The air cylinder 19 is located in a posture where an operating shaft thereof is directed along the vertical direction. The driving magnet 21 is attached to a tip end of the operating shaft of the air cylinder 19. The chuck drive mechanism 17 is operated in response to a chuck operation command. When the chuck drive mechanism 17 is in an actuated state, the driving magnet 21 moves upward to approach the chucks 9. When the chuck drive mechanism 17 is in a non-actuated state, the driving magnet 21 moves downward to move apart from the chucks 9.

The chucks 9 each include a bias mechanism not shown. When the driving magnet 21 moves downward, the chuck 9 comes into a closed position. When the driving magnet 21 moves upward, the chuck 9 comes into an open position. In the closed position, the periphery edge supporting portion 13 rotates about the rotation center P2, and approaches toward the rotation center P1 to contact the periphery edge of the substrate W. This can cause the chucks 9 to grip the substrate W at the closed position. In the open position, the periphery edge supporting portion 13 rotates about the rotation center P2, and moves apart from the rotation center P1. This can cause the chucks 9 to load and unload the substrate W at the open position. Here, when the driving magnet 21 moves downward while the substrate W is not placed, the periphery edge supporting portion 13 is moved into an origin position shifted slightly inward from an outer diameter of the substrate W. In other words, the periphery edge supporting portion 13 is located more adjacent to the rotation center P1 at the origin position of the chucks 9 than at the closed position.

An origin sensor Z1 is located adjacent to the rotating magnet 15 of the chuck 9. The origin sensor Z1 changes an output signal when the chuck 9 moves to the closed position or the origin position. For example, the origin sensor Z1 turns an output signal on when the chuck 9 moves to the closed position or the origin position.

A guard 23 is arranged around the spin chuck 3. The guard 23 surrounds the spin chuck 3 laterally. The guard 23 prevents scattering of a treatment liquid to the surrounding. The guard 23 has a tubular shape. An opening 23a of the guard 23 is formed at an upper part. An internal diameter of the opening 23a is larger than an outer contour of the spin chuck 3.

The guard 23 includes a guard moving mechanism 25. The guard moving mechanism 25 includes an air cylinder 27 and a locking piece 29, for example. The guard moving mechanism 25 is located adjacent to an outer periphery of the guard 23, for example. The guard moving mechanism 25 may be located adjacent to an inner periphery of the guard 23 as long as the guard 23 can move upward and downward. The air cylinder 27 is located in an attitude where an operating shaft thereof is directed toward the vertical direction. The locking piece 29 is attached to a tip end of the operating shaft of the air cylinder 27. The locking piece 29 is fixed to an outer peripheral face of the guard 23. The guard moving mechanism 25 is not limited to this construction as long as the guard 23 can move upward and downward.

The guard moving mechanism 25 moves the guard 23 between the origin position and the treating position in response to a guard operation command. The origin position is a position where an upper end of the guard 23 is low. The origin position is lower than the treating position. The treating position is higher than the origin position. An upper edge of the guard 23 is lower than the substrate W, supported by the spin chuck 3, in a state where the guard 23 is located at the origin position. The upper edge of the guard 23 is higher than the substrate W, supported by the spin chuck 3, in a state where the guard 23 is located at the treating position. For example, an origin sensor Z2 is located adjacent to the inner periphery of the guard 23. The origin sensor Z2 changes an output signal when the guard 23 moves to the origin position. For example, the origin sensor Z2 turns an output signal on when the guard 23 moves to the origin position.

The guard 23 includes a plurality of drain ports, not shown, adjacent to the inner periphery thereof. It is preferred that a plurality of guards 23 are provided such that the guard moving mechanism 25 moves upward and downward to perform switching of the drain ports. In this case, the drain ports are switched in accordance with the treatment liquid, and accordingly, the guard moving mechanism 25 changes levels of the guards 23.

A treatment liquid supplying mechanism 31 is located adjacent to the outer periphery of the guard 23. The treatment liquid supplying mechanism 31 includes a nozzle 33 and a nozzle moving mechanism 35, for example. In the present embodiment, the treatment liquid supplying mechanism 31 includes two nozzles 33, for example. In the following description, a nozzle on the left side in FIG. 2 is referred to as a nozzle 33A and a nozzle on the right side is referred to as a nozzle 33B appropriately if the two nozzles 33 need to be distinguished. The number of nozzles 33 of the treatment liquid supplying mechanism 31 may be one or three or more. In the present embodiment, the two nozzles 33 have the same construction.

The nozzle 33 includes an extension part 33a, a hang-down part 33b, and a distal end 33c. One end of the extension part 33a of the nozzle 33 is attached to a base part 37. The extension part 33a extends in a horizontal direction. The other end of the extension part 33a is connected to the hang-down part 33b. The hang-down part 33b extends downward along the vertical direction from the extension part 33a. The distal end 33c forms a lower end of the hang-down part 33b. The distal end 33c ejects a treatment liquid from a lower face thereof. Examples of the treatment liquid include a photoresist, a spin-on glass (SOG) liquid, a developer, a rinse liquid, deionized water, and a cleaning liquid.

The nozzle moving mechanism 35 includes a motor 39, a rotary shaft 41, and a position detector 43, for example. The motor 39 is arranged in a vertical posture. The rotary shaft 41 is rotated around a rotation center P3 by the motor 39. The rotary shaft 41 is connected to the base part 37. The base part 37 is rotated by drive of the motor 39. The nozzle 33 swings around the rotation center P3 together with the base part 37. The position detector 43 detects a rotation position of the rotary shaft 41. The position detector 43 detects an angle of the rotary shaft 41 around the rotation center P3 in plan view. The position detector 43 outputs a pulse in accordance with the rotation position.

A standby cup 44 is located at a position apart laterally from the guard 23 in plan view. The standby cup 44 is located opposite to the base part 37 and adjacent to the distal end 33c of the nozzle 33 in plan view. The standby cup 44 is located at the origin position of the nozzle 33. The standby cup 44 prevents drying of the distal end 33c of the nozzle 33. The standby cup 44 is used for idle ejection of the nozzle 33. The nozzle moving mechanism 35 drives the motor 39 to swing the nozzle 33. The nozzle moving mechanism 35 moves the distal end 33c between the origin position and the ejecting position of the nozzle 33 above the rotation center P1 of the spin chuck 3.

For example, an origin sensor Z3 is located adjacent to an outer periphery of the rotary shaft 41. The origin sensor Z3 changes an output signal when the nozzle 33 is located at the origin position. For example, the origin sensor Z3 turns an output signal on when the nozzle 33 moves to the origin position. Here, the origin sensor Z3 is omittable for a simple construction. In this case, a projection is provided on a part of the rotary shaft 41 and a projection is provided on a fixed and immovable side of the rotary shaft 41. The projections contact through rotation of the rotary shaft 41 and the position detector 43 detects a position where no more rotation is possible. The position is set as the origin position. Such configuration can be adopted. In this case, a position where a pulse of the position detector 43 is invariable may be set as the origin position.

A fixed nozzle RN is located at a position apart laterally from the guard 23 in plan view. The fixed nozzle RN is arranged on a line, for example, that connects a standby pot 44 and the rotation center P1 in plan view. A position of the fixed nozzle RN is fixed. The position is fixed in a height direction and a horizontal direction. A distal end of the fixed nozzle RN is directed toward the rotation center P1. The fixed nozzle RN supplies a treatment liquid. The treatment liquid is supplied from a treatment liquid supplying unit SU to the fixed nozzle RN. Examples of the treatment liquid include deionized water, and a cleaning liquid. The treatment liquid supplying unit SU includes, for example, a control valve, a flow rate regulating valve, and a treatment liquid supplying source, not shown. When the treatment liquid is supplied from the treatment liquid supplying unit SU to the fixed nozzle RN, the treatment liquid is ejected in an annularly trace line, for example. A flow rate or a flow speed of the treatment liquid ejected from the fixed nozzle RN is adjusted by a flow rate regulating valve, not shown, so as for the treatment liquid to drop near an intersection of a front face of the substrate W and the rotation center P1.

A camera CM is attached to one area of the casing CA. For example, the camera CM is attached in a predetermined location corresponding to a corner adjacent to the guard moving mechanism 25 and on which side the standby cup 44 of the nozzle 33 is located in plan view. Here, a position where the camera CM is located may be any location as long as a component, described later, is within the field of view. A lens of the camera CM has a viewing angle at which the component described later is entirely within the field of view. The component is an element that constitutes the substrate treating apparatus 1. The component includes a fluid like the treatment liquid. The component is almost one whose position moves over time due to execution of the recipe. The camera CM captures a static image. The camera CM can also capture a video image at a predetermined number of frames per hour.

The substrate treating apparatus 1 further includes a control unit 45, an instruction unit 47, and a notification unit 49. Details of the control unit 45 is to be described later. The instruction unit 47 is operated by an operator of the substrate treating apparatus 1. The instruction unit 47 is, for example, a keyboard or a touch panel. The instruction unit 47 instructs a component, a timing to check, a tolerance, recipes, start of processing, and the like, which are to be described later. When the control unit 45 determines the presence of an abnormality, the notification unit 49 notifies the abnormality to the operator. Examples of the notification unit 49 include an indicator, a lamp, and a speaker.

2. Construction of Control System

Figure 3:
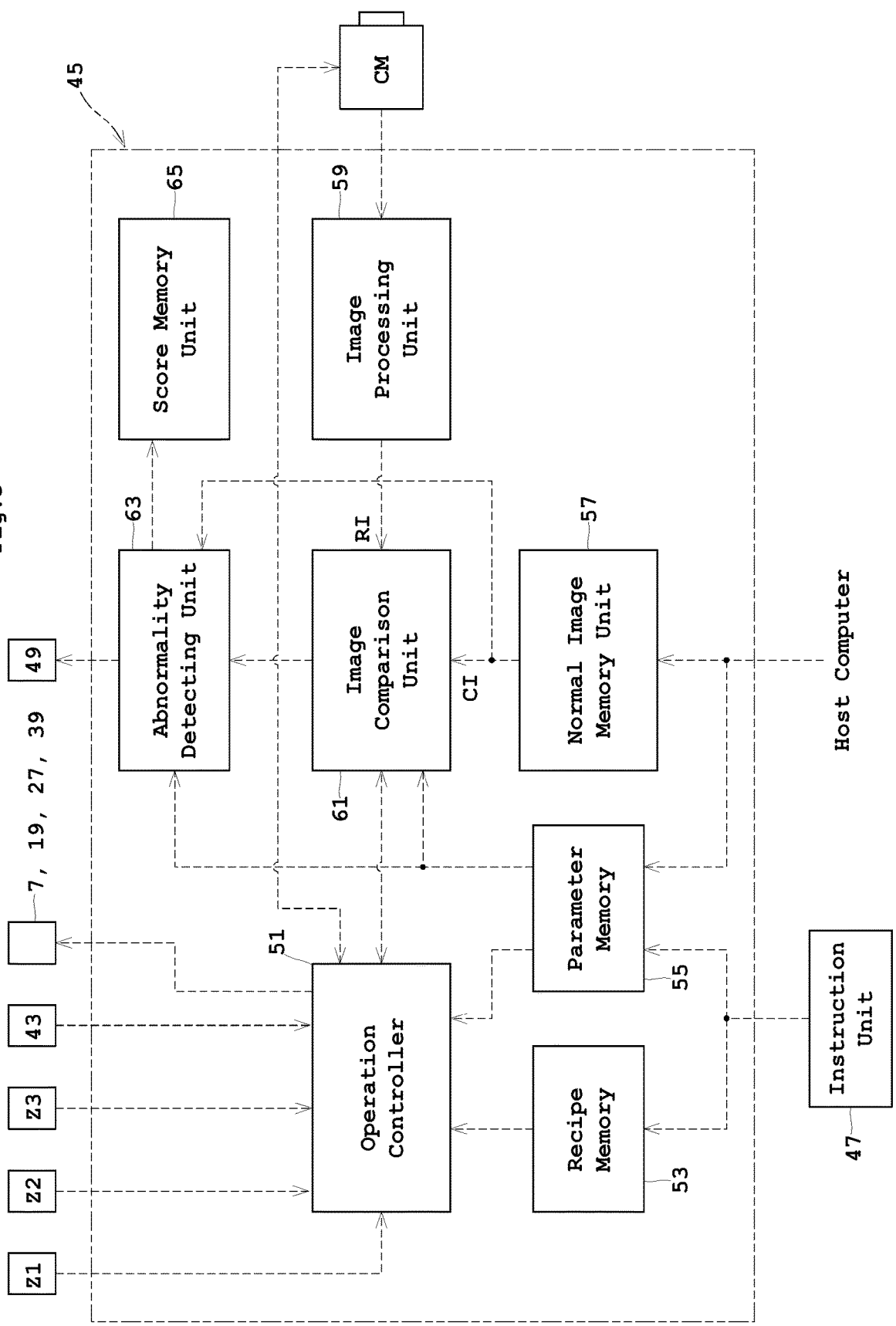
FIG. 3 is a block diagram of the substrate treating apparatus according to the embodiment.

Reference is now made to FIG. 3. FIG. 3 is a block diagram of the substrate treating apparatus according to the embodiment.

The control unit 45 includes a CPU and a memory, for example. The control unit 45 is formed by a plurality of function blocks. Specifically, the control unit 45 includes an operation controller 51, a recipe memory 53, a parameter memory 55, a normal image memory unit 57, an image processing unit 59, an image comparison unit 61, an abnormality detecting unit 63, and a score memory unit 65.

The operation controller 51 operates the motors 7 and 39, the air cylinders 19 and 27, the camera CM, and the treatment liquid supplying unit SU described above. The operation controller 51 receives signals from the origin sensors Z1 to Z3, and the position detector 43. The operation controller 51 operates in response to a recipe specified by the recipe memory 53. For example, the operator instructs a recipe and start of processing, and thereafter the operation controller 51 outputs various types of operation commands in accordance with the recipe to actuate the motor 7 and the like at a predetermined timing.

The recipe memory 53 stores various types of recipes in advance. The recipes define various procedures for treating the substrate W. The recipe specifies operation details and an execution order of a component and a timing of the execution, for example. Specific examples and details of the recipe are to be described later. The operator can operate the instruction unit 47 to instruct a desired recipe.

The parameter memory 55 stores a target component to be detected for abnormal operation described later, a timing to check, a tolerance, and the like. The component is one of elements, forming the substrate treating apparatus 1, that is detected for abnormality. The timing to check is a timing for checking an operational status of the component. The timing to check is one time point on a time base of the recipe described later. The timing to check synchronizes the execution of the recipe. The timing to check corresponds to one normal image described later. The timing to check is specified during simulation described later, and a desired timing to check can be specified from the instruction unit 47. The operator may optionally operate the instruction unit 47 to set the component, the timing to check, the tolerance and the like. The operator may cause the instruction unit 47 to instruct which element is set as the component to be detected for abnormal operation, which timing is set as the timing to check, to which degree a timing error or a positional error is acceptable as the tolerance.

The component is, for example, the chuck 9, the guard 23, the nozzle 33, and a treatment liquid from the fixed nozzle RN. The timing to check is, for example, a predetermined timing where the nozzle 33 is moved from the origin position to the ejecting position by the nozzle operation command, and a predetermined timing when the treatment liquid is ejected from the fixed nozzle RN.

The tolerance indicates a degree of acceptance of deviation of the real image, described later, for a position where the target component should be (normal image to be described later) if normal operation is performed at the timing to check. The tolerance indicates, for example, an acceptable degree of deviation from a position or an angle where the component is intended by design. The tolerance indicates a range of the deviation of the target component at the timing to check that allows treatment to the substrate W even if the component deviates from the position or the angle intended by design at the timing to check with respect to the treatment to the substrate W as a reference.

The operation controller 51 described above informs the image comparison unit 61 and the camera CM of the timing to check while executing the recipe in accordance with the timing to check in the parameter memory 55.

The normal image memory unit 57 stores a normal image in advance. The normal image is, for example, a static image. The normal image is stored for each recipe stored in the recipe memory 53 in association with the timing to check. The normal image is an image based on the three-dimensional design information about assembly and operation of the substrate treating apparatus 1. The normal image is an image obtained by a simulator simulating a condition in advance where the component normally operates in response to the recipe in accordance with the three-dimensional design information of the substrate treating apparatus 1 and at this time viewed from the location same as that of the camera CM in a host computer. The normal image is an image obtained in association with a timing to check on a time base of the recipe. A plurality of timings to check may be set at the simulation. In other words, a plurality of normal images can be provided for one recipe. The set timing to check is in association with the recipe. The timing to check is transmitted from the host computer to the parameter memory 55. Specifically, the design information of component corresponds to design information about the components that constitute the substrate treating apparatus 1 and a substrate W to be treated. The design information is, for example, data of three-dimensional computer aided design (3D CAD). The design information may contain physical property information about the treatment liquid and various materials used for treatment.

3D CAD data is represented by three axes of orthogonal coordinate, for example. When the components are arranged in a three-dimensional space, the 3D CAD data is represented by positional information about a position and an angle. A host computer, not shown, stores three-dimensional design information as the 3D CAD data about all the components and materials of the substrate treating apparatus 1. The simulator is used for simulating operation of the substrate treating apparatus 1. The simulator is executed by the host computer. The simulator receives the three-dimensional design information of the substrate treating apparatus 1 and the recipes. The simulator can operate the substrate treating apparatus 1 in response to the recipe. The simulator can operate the components in response to the recipe at predetermined timing and order. In other words, the simulator can operate the substrate treating apparatus 1, assembled along the three-dimensional design information, normally in response to the recipe virtually.

The image processing unit 59 processes the real image captured by the camera CM. The image processing unit 59 performs an image processing to the real image, and extracts a real image containing a two-dimensional shape of the component. The image processing unit 59 performs contour extraction to all the components in the real image, for example. Here, a contour contains not only an outer contour but also an edge part inside of the outer contour. The real image extracted by the image processing unit 59 is sent to the image comparison unit 61.

The image comparison unit 61 performs comparison between the images. Specifically, comparison is made between the normal image and the real image. The normal image is an image sent from the normal image memory unit 57. The real image is an image sent from the image processing unit 59. The normal image and the real image are synchronized with execution of the recipe by the operation controller 51. That is, the normal image is captured at the timing to check in the recipe when the simulator executes the recipe in advance. The real image is an image that the operation controller 51 causes the camera CM to capture in accordance with the timing to check from the parameter memory 53 associated with the recipe when the recipe is executed. The image comparison unit 61 performs comparison between the normal image and the real image to identify components in the normal image and components in the real image. With such identification, the same components can be compared with each other among the components present in the normal image and the components present in the real image.

The abnormality detecting unit 63 performs comparison between the normal image and the real image synchronized by the recipe and detects an abnormality in accordance with a difference between the images. The abnormality is detected taking into consideration of a tolerance in the parameter memory 55. In other words, an abnormality is not detected if positions and the like of the components in the normal image and the real image are not coincident accurately but are within the tolerance. The abnormality detecting unit 63 causes the notification unit 49 to perform notification operation in accordance with the detection results. Specifically, the abnormality detecting unit 63 causes the notification unit 49 to perform notification operation only when an abnormality is detected. The notification unit 49 may perform notification operation about the component detected as abnormal or a degree of difference together with occurrence of the abnormality, for example. It is also preferred that the abnormality detecting unit 63 calculates the degree of difference as a score.

The score memory unit 65 stores the score calculated by the abnormality detecting unit 63. It is preferred that the score memory unit 65 stores the score in association with the timing to check. This can determine not only a degree of abnormality but also when and how large the abnormality occurs in accordance with a size of the score.

3. Details of Recipe

The following describes the recipe with reference to FIG. 4. Here, FIG. 4 is a schematic view of details of the recipe as one example.

In this example, the recipe is formed by a process and a processing content. The process defines an execution order. The processing content defines what operation is performed. Specifically, the processing content defines operation details of the component. In detail, the recipe is divided into recipe steps that define further detailed operations. However, description of the recipe steps is to be omitted for easy understanding of the invention. In addition, detailed processing to be actually performed is omitted.

The recipe contains the following contents as under, for example.

In a first process, preparation of processing a treatment liquid (guard movement) is performed, and the guard 23 is moved to a treating position. In a second process, the preparation of processing a treatment liquid (nozzle movement) is performed, and the nozzle 33 is moved to an ejecting position. In a third process, start of processing a treatment liquid is performed, and treatment of a substrate W with the treatment liquid starts. In a sixth process, completion of processing the treatment liquid is performed, and thus the processing with the treatment liquid is completed. In a seventh process, start of a regular rinse treatment is performed, and treatment with the fixed nozzle RN starts. In a tenth process, completion of the regular rinse treatment is performed, and thus the processing with the fixed nozzle RN is completed. In an eleventh process, start of a rinse treatment is performed, and thus the treatment with the rinse liquid from the nozzle 33 starts. In a fourteenth process, completion of the rinse treatment is performed, and thus completion of the treatment with the rinse liquid from the nozzle 33 is performed (including movement of the nozzle 33). In a fifteenth process, start of a dry processing is performed, and thus a process of increasing a number of rotations of a motor 7 starts. In an eighteenth process, completion of the dry processing is performed, and thus the motor 7 stops. In a nineteenth process, completion of the recipe processing is performed, and a process of unloading the substrate W is performed.

4. Normal Image and Real Image

Figure 5A:
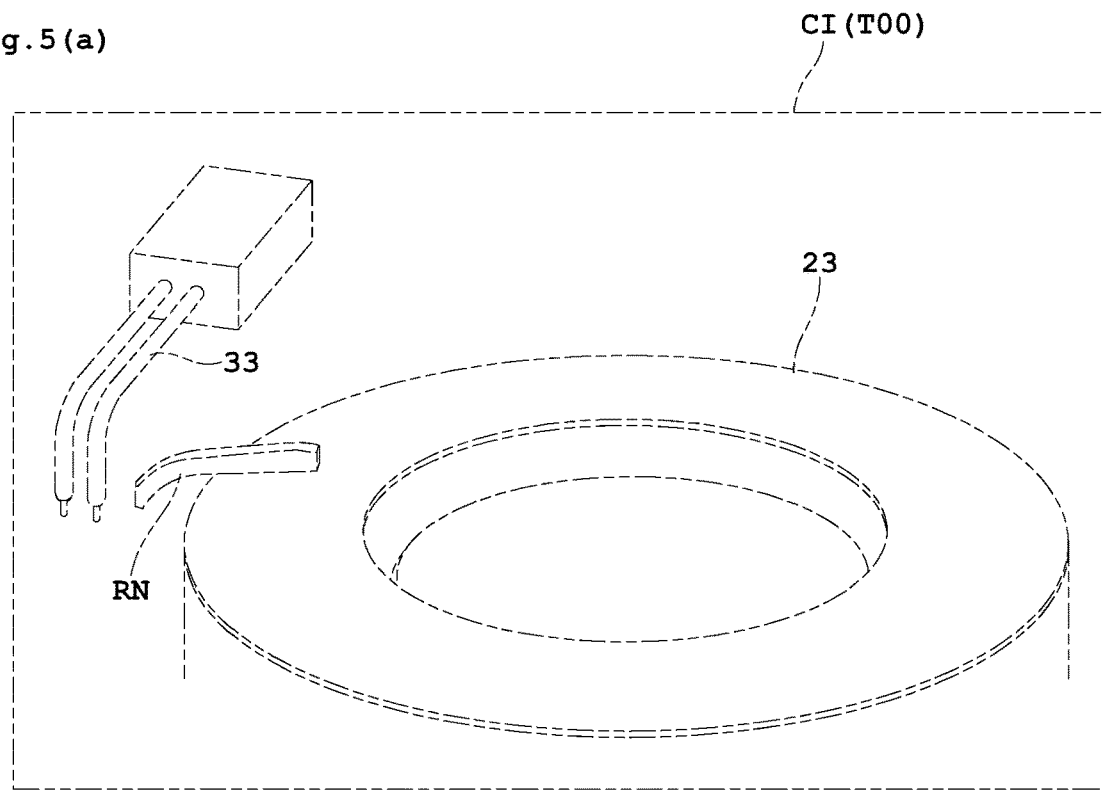
FIG. 5(a) is a schematic view of one example of a normal image.
Figure 5B:
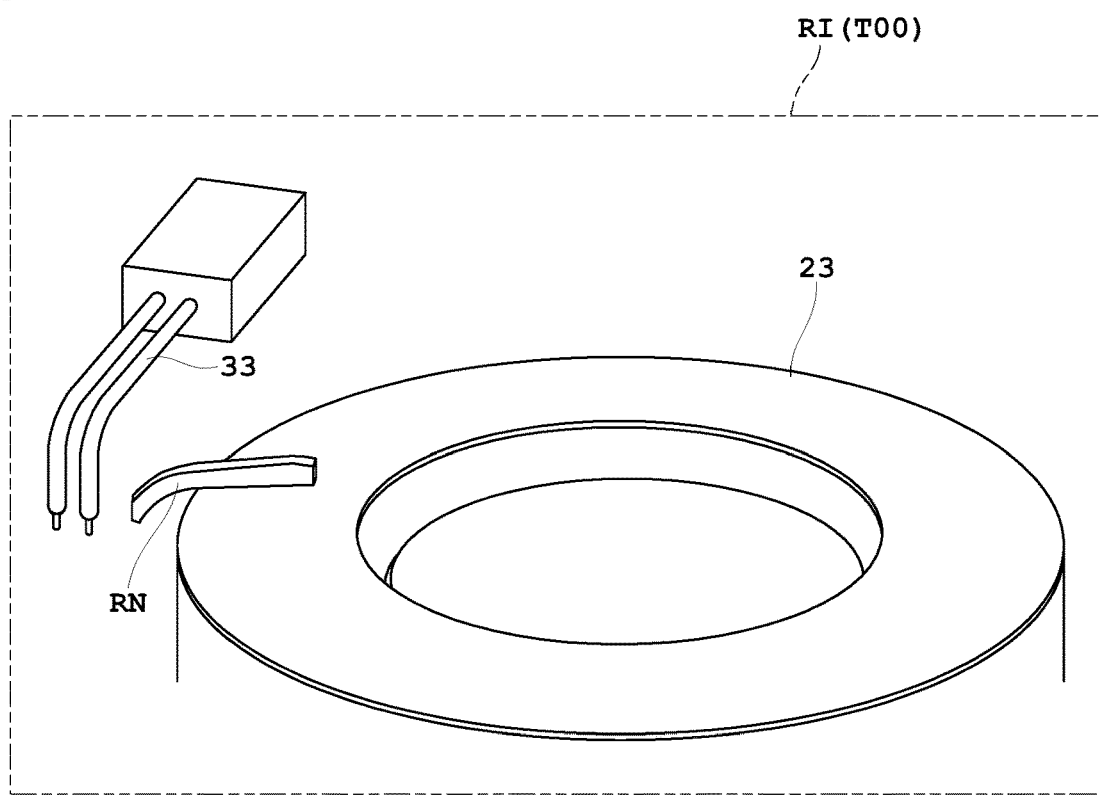
FIG. 5(b) is a schematic view of one example of a real image.
Figure 6A:
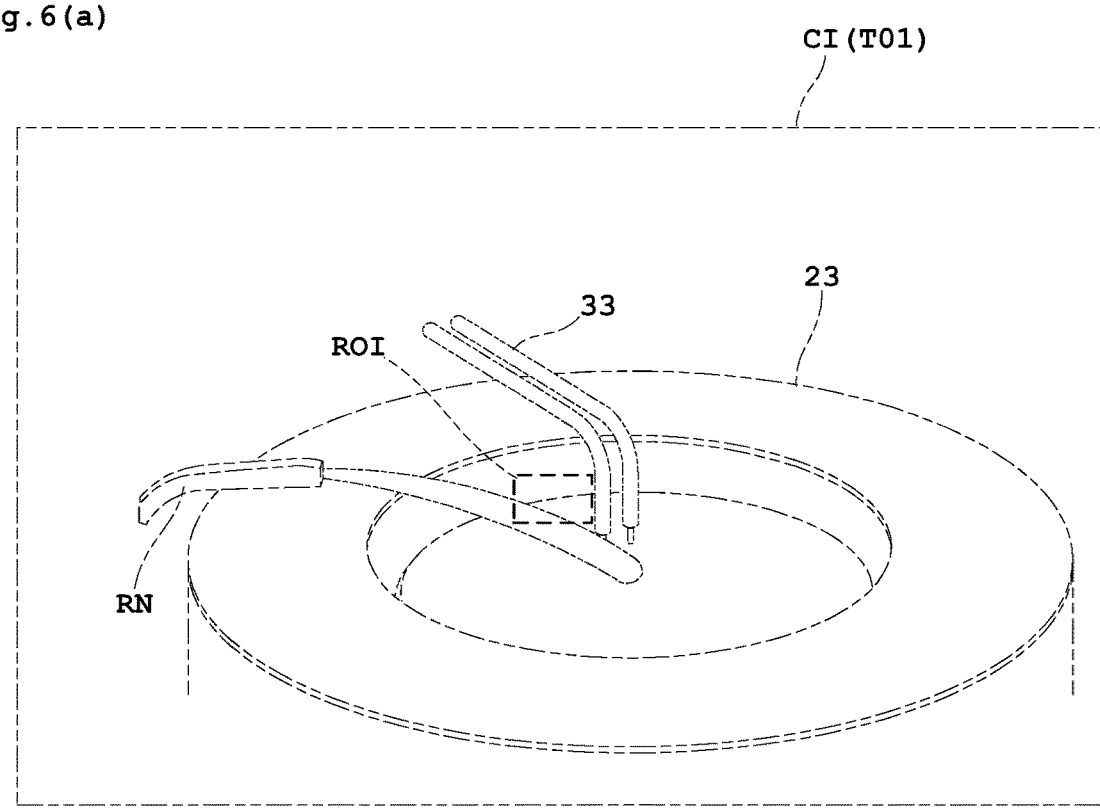
FIG. 6(a) is a schematic view of one example of a normal image about a fixed nozzle.
Figure 6B:
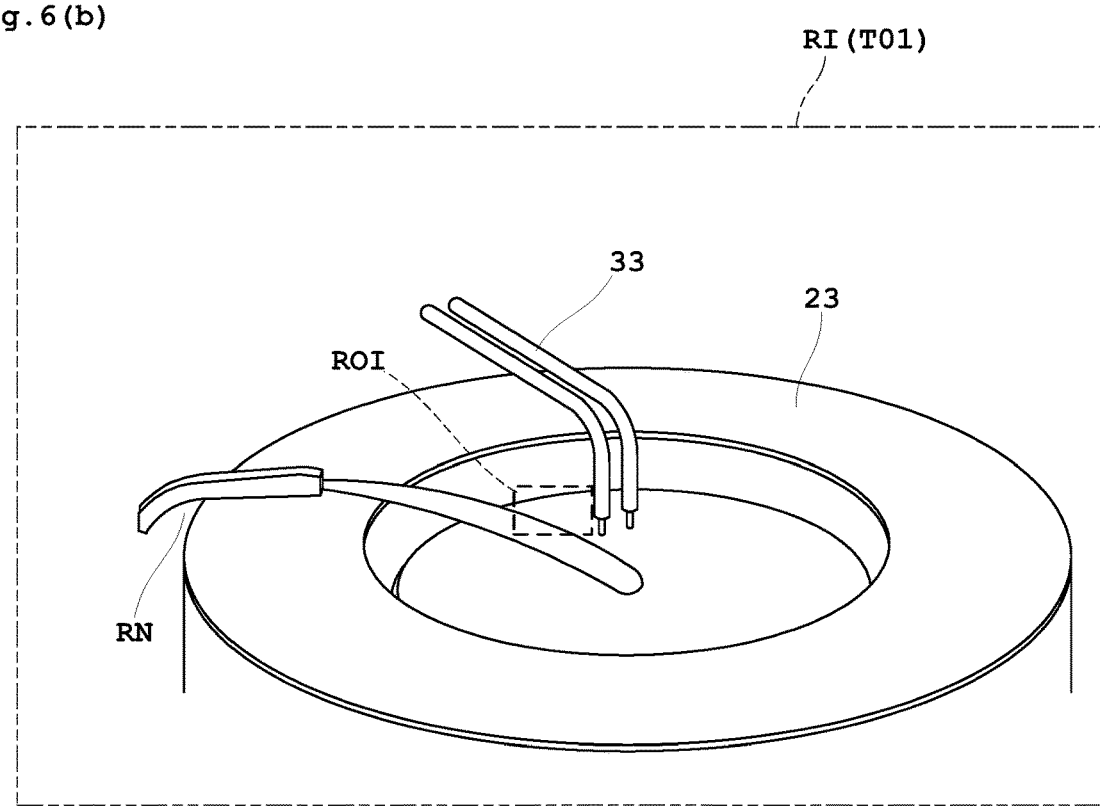
FIG. 6(b) is a schematic view of one example of a real image about the fixed nozzle.

Description is now made of the normal image and the real image with reference to FIGS. 5 and 6. Here, FIG. 5(a) is a schematic view of one example of the normal image, and FIG. 5(b) is a schematic view of one example of the real image. FIG. 6(a) is a schematic view of one example of the normal image about a fixed nozzle, and FIG. 6(b) is a schematic view of one example of the real image about the fixed nozzle.

FIG. 5(a) is one example of a normal image CI at one timing to check. At this timing to check, such a condition is shown that the guard 23 moves upward to the treating position and the nozzle 33 is moved to the origin position, for example. Here, a parenthesis is added to a symbol CI to indicate the timing to check by a symbol T plus number. For example, the normal image in FIG. 5(a) is denoted by CI(T00). FIG. 5(b) is one example of a real image RI(T00) captured at a timing to check T00 while the substrate treating apparatus 1 is in a normal condition. In a condition where the substrate treating apparatus 1 is at work, the image comparison unit 61 compares the normal image CI(T00) with the real image RI(T00).

FIG. 6(a) is one example of a normal image CI at another timing to check T01 from FIG. 5. At this timing, such a condition is shown that the guard 23 moves upward to the treating position, the nozzle 33 is moved to the ejecting position, and the treatment liquid is ejected from the fixed nozzle RN, for example. For example, the normal image in FIG. 6(a) is denoted by CI(T01). FIG. 6(b) is one example of a real image RI(T01) captured at a timing to check T01 while the substrate treating apparatus 1 is in a normal condition. In a condition where the substrate treating appa-
ratus 1 is at work, the image comparison unit 61 compares the normal image CI(T01) with the real image RI(T01).

As illustrated in FIGS. 6(a) and 6(b), a region of interest ROI is each set in the normal image CI(T01) and the real image RI(T01). When the regions of interest ROI are set, the image comparison unit 61 also compares the regions of interest ROI between each other. The region of interest ROI in this example is set adjacent to an upper edge around the center portion of a trace line of the treatment liquid, ejected from the fixed nozzle RN, between an ejection port of the fixed nozzle RN and a portion on the front face of the substrate W where the treatment liquid drops. Accordingly, the comparison is made for an upper edge shape formed by a flow of the treatment liquid. The comparison can detect an abnormality at a treatment liquid supplying unit SU of the fixed nozzle RN.

Figure 7:
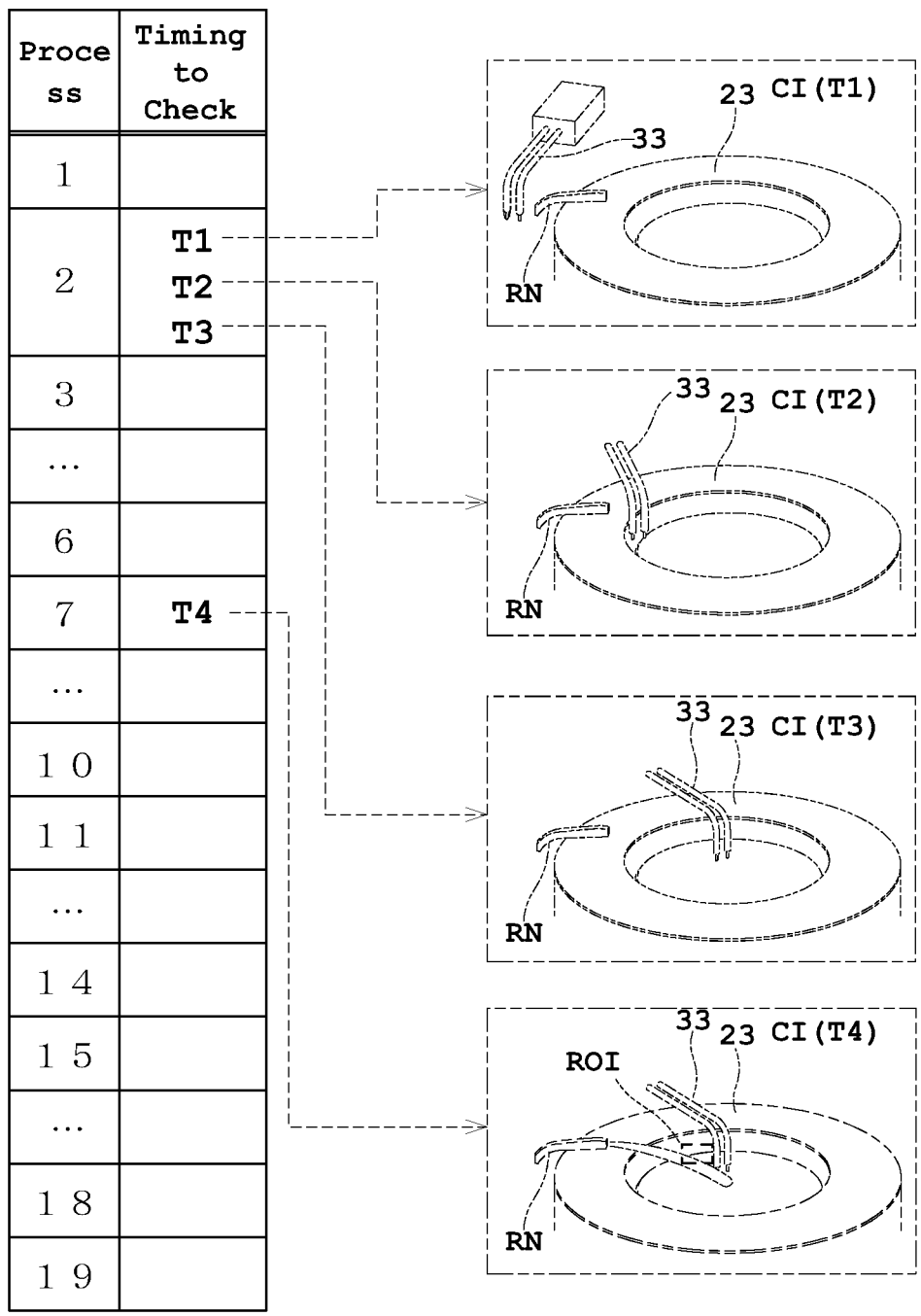
FIG. 7 is a schematic view for explanation of synchronization of the recipe and the normal image.

Reference is now made to FIG. 7. Here, FIG. 7 is a schematic view for explanation of synchronization of the recipe and the normal image.

The recipe and the normal image are synchronized by associating the process of the recipe with the timing to check, for example. In FIG. 7, only the processes are illustrated as part of the recipe, and the processes are in correspondence with the timings to check T1 to T4 individually. The timings to check T1 to T4 are set with reference to a start timing of the recipe. In the example of the recipe, the timings to check T1 to T4 are set with reference to a start timing of the first process. Here, the timings to check T1 to T4 may be set with reference to any process (step) of the processes (steps) that form the recipe. As described later, when the substrate treating apparatus 1 is at work, the real image is captured in response to the timing to check of the recipe, and comparison is made between the normal image and the real image. Accordingly, the normal image and the real image are synchronized with operation in the recipe.

In this example, it is assumed that a timing to check is each set in the third process and the seventh process as shown in FIG. 7, for example. In the third process, timings to check T1 to T3 are set. In the seventh process, a timing to check T4 is set. The timing to check T1 corresponds to a normal image CI(T1) where the nozzle 33 is at the origin position. The timing to check T2 corresponds to a normal image CI(T2) where the nozzle 33 is on the way to the ejecting position. The timing to check T3 corresponds to a normal image CI(T3) where the nozzle 33 is moved to the ejecting position. The timing to check T4 corresponds to a normal image CI(T4) where the treatment liquid is ejected from the fixed nozzle RN and the region of interest ROI is set.

5. Specific Example of Treatment

Figure 8:
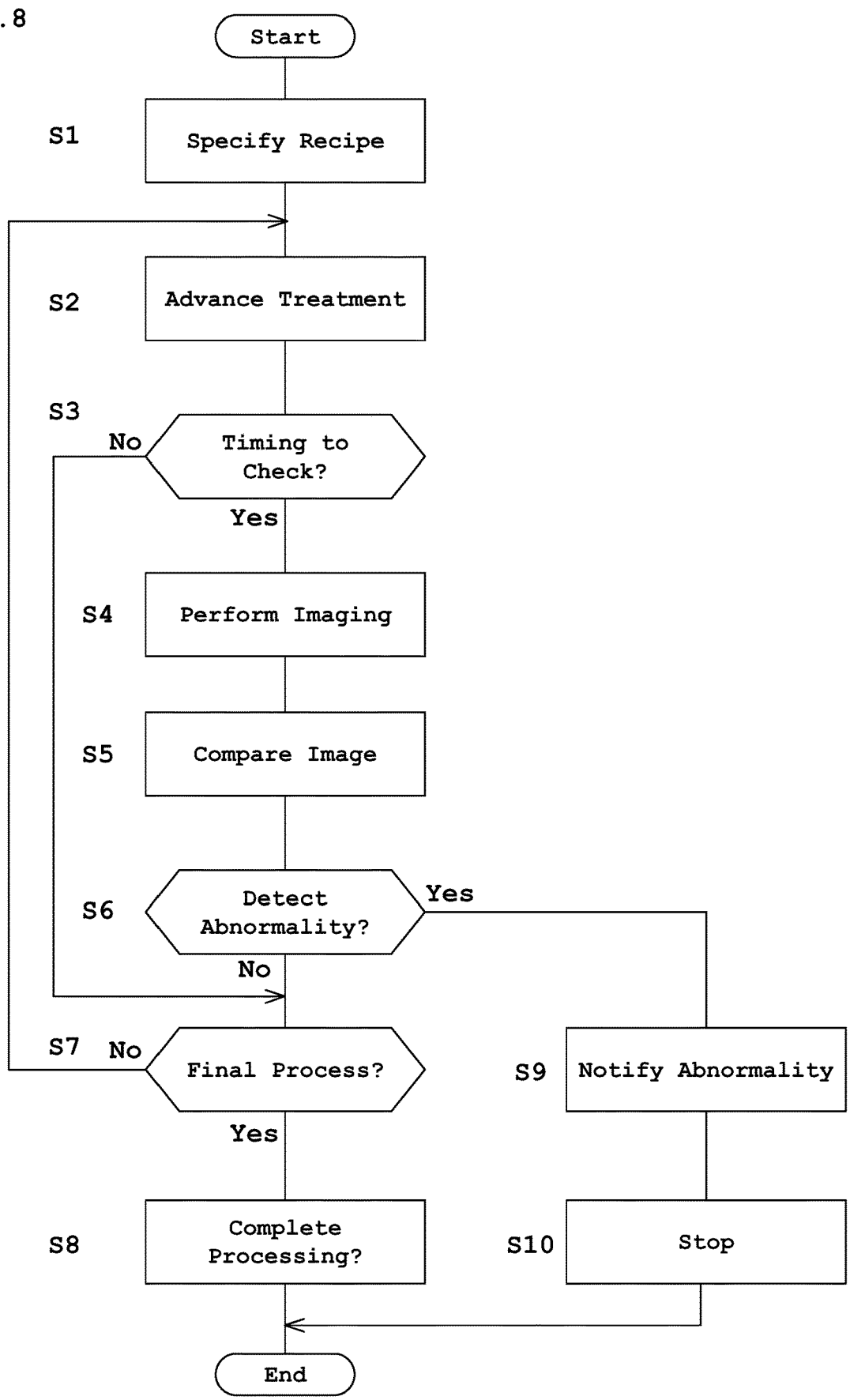
FIG. 8 is a flowchart illustrating a series of treatment of the substrate treating apparatus according to the embodiment.
Figure 9:
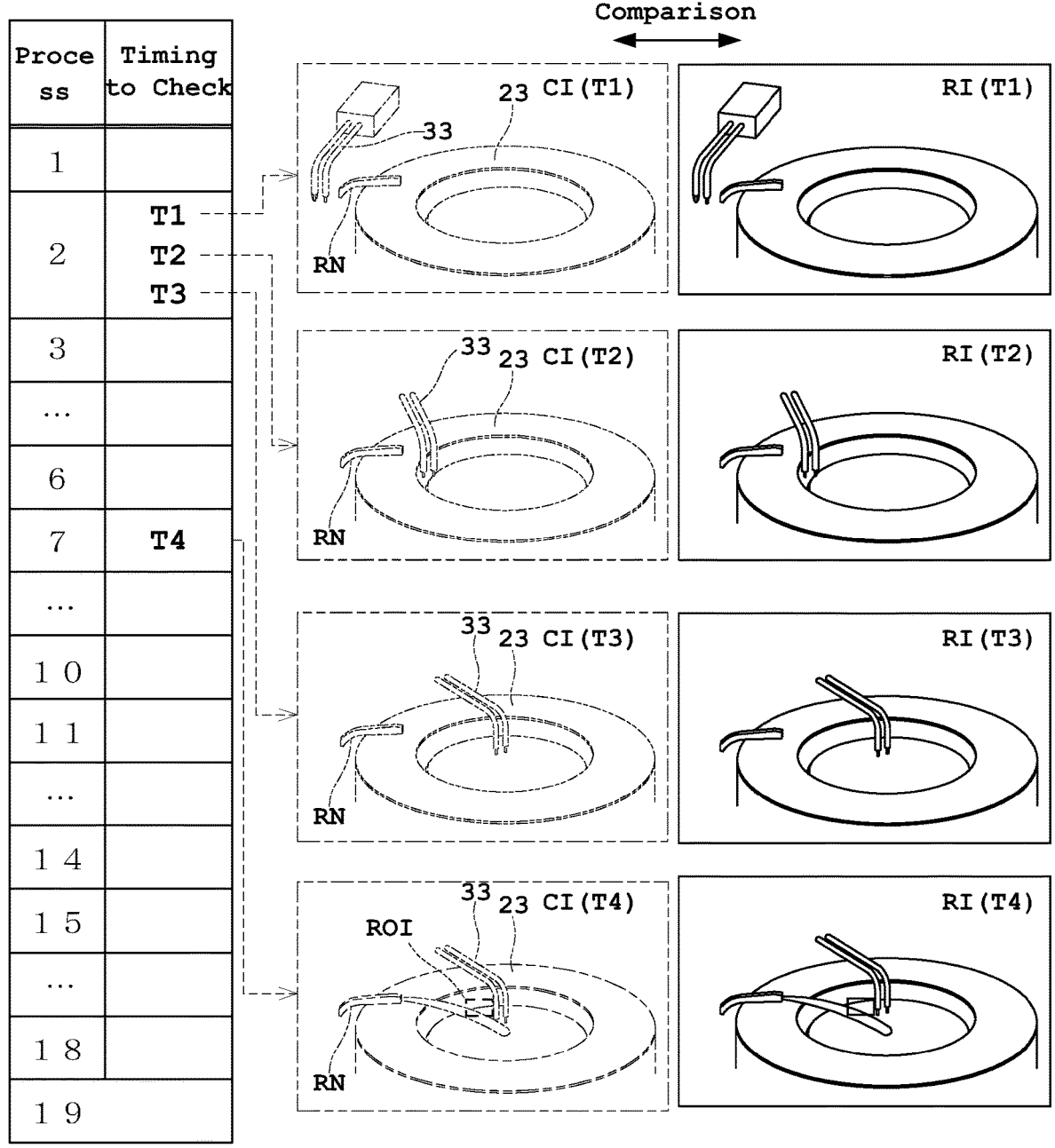
FIG. 9 is a schematic view for explanation of comparison between the normal image and the real image when an apparatus is at work.

Description is now made of the treatment with reference to FIGS. 8 and 9. Here, FIG. 8 is a flowchart illustrating a series of treatment of the substrate treating apparatus according to the embodiment. FIG. 9 is a schematic view for explanation of comparison between the normal image and the real image when an apparatus is at work.

Step S1

The operator can operate the instruction unit 47 to specify a desired recipe. The operator operates the instruction unit 47 as necessary to specify a desired timing to check among the timings to check associated with the specified recipe. If no timing to check is specified, all the associated timings to check may be specified. Here in this example, it is assumed that the recipe shown in FIG. 4 is specified. In addition, it is assumed that the timings to check T1 to T4 shown in FIG. 7 are all specified. Here, it is assumed that a substrate W to be treated is already held with the chucks 9.

Step S2

The operation controller 51 operates each component in response to the recipe to advance the treatment. For example, the first process is executed along with the recipe shown in FIG. 4. Specifically, the operation controller 51 operates the guard moving mechanism 25. Then, the operation controller 51 moves the guard 23 from the origin position to the treating position.

Step S3

It is determined whether it is the timing to check or not, and then the processing is branched. Specifically, the operation controller 51 refers to the parameter memory 55 to determine whether or not there is a timing to check corresponding to the process in the recipe. As shown in FIG. 9, since the timing to check is not set in the first process in the recipe, the processing is branched to the step S7.

Step S7

The operation controller 51 branches the processing in accordance with whether the recipe is the final process or not. Here, since only the first process is executed, the processing returns to the step S2.

Step S2

The operation controller 51 executes a next second process in accordance with a recipe. Specifically, the operation controller 51 performs preparation of the treatment liquid. Specifically, the operation controller 51 operates the nozzle moving mechanism 35. The operation controller 51 operates the nozzle moving mechanism 35 to move the nozzle 33 from the origin position to the ejecting position.

Step S3

It is determined whether it is the timing to check, and then the process is branched. Here, as shown in FIG. 9, since the timings to check T1 to T4 are set, the processing is shifted to the step S4.

Step S4

Imaging is performed. Specifically, the operation controller 51 operates the camera CM to perform imaging at the timing to check T1. A captured image is a real image RI(T1).

Step S5

Image comparison is made. Specifically, the image comparison unit 61 sets a condition where the same components can be compared in the normal image CI(T1) and the real image RI(T1), corresponding to the timing to check T1, in the normal image memory unit 57.

Step S6

The abnormality detecting unit 63 performs comparison between the normal image CI(T1) and the real image RI(T1) synchronized by the recipe and detects an abnormality in accordance with a difference between the images. At this time, a tolerance in the parameter memory 55 is preferably taken into consideration. Consequently, this can prevent false detection of an abnormality caused by the processing errors or assembly errors. Like the second process as above, the steps S3 to S6 are repeated as long as no abnormality is determined in the step S6 when a plurality of timings to check are set in the same process. In this example, since the three timings to check T1 to T3 are set in the second process, the steps S4 to S6 are repeatedly performed at all the timings to check T1 to T3 as long as no abnormality is detected.

Here, the processing is shifted to the step S7 under an assumption that no abnormality is detected.

Step S7

The operation controller 51 branches the processing in accordance with whether the recipe is the final process or not. Here, since only the second process is executed, the processing returns to the step S2.

Step S2

The operation controller 51 executes further processing in accordance with a recipe. Here, it is assumed that the steps S2 and steps S3 and S7 are repeatedly performed during the third to sixth processes.

Step S2

The operation controller 51 executes a seventh process in accordance with a recipe.

Steps S3 to S6

As shown in FIG. 9, a timing to check T4 is set in the seventh process. Accordingly, the operation controller 51 causes the camera CM to perform imaging. The abnormality detecting unit 63 detects an abnormality in accordance with a difference between the components while the image comparison unit 61 can make comparison of the same component between a normal image (T4) and a real image (T4). Since regions of interest ROI are provided in the normal image (T4) and the real image (T4) individually, comparison of the regions of interest ROI is also made. Here, under assumption that no abnormality is detected, the processing is shifted to the step S7.

Steps S7, S8

It is assumed that the processing described above advances in accordance with the recipe as shown in FIG. 4 and FIG. 9 to a nineteenth process as the final process. Since the nineteenth process is the final process of the recipe, the processing is branched to the step S8 to be completed. This finishes the treatment to the substrate W with the recipe.

The following describes a case where the abnormality detecting unit 63 detects an abnormality in the step S6 described above. In this case, the process is shifted to the step S9.

Step S9

When the abnormality detecting unit 63 detects an abnormality, the abnormality detecting unit 63 causes the notification unit 49 to perform notification operation. At this time, the abnormality detecting unit 63 calculates a score in accordance with a difference upon detecting the abnormality. It is preferred that the score is of a size in number proportional to the difference. This can determine a degree of abnormality in accordance with the size of the score.

Step S10

The operation controller 51 stops the processing. This can prevent continuous improper treatment to the substrate W by the substrate treating apparatus 1.

According to this example, the abnormality detecting unit 63 detects an abnormality in accordance with the difference between the normal image CI synchronized with operation of the recipe and the real image RI at work when the operation controller 51 actually treats the substrate W in response to the recipe. The normal image CI is an image obtained by simulating a condition in advance where the component normally operates in response to the recipe and storing in advance the normal image at this time in the view from the location of the camera CM in accordance with the three-dimensional design information of the substrate treating apparatus 1. Accordingly, since all the apparatus have the same imaging condition, an adverse effect due to difference in imaging condition can be avoided. Moreover, the normal image CI to be compared can be prevented from deviation from the real image RI since it is synchronized with the operation of the recipe. Accordingly, an abnormality can be detected accurately at work.

Here, a correspondence between the above example and the present invention is as under.

The camera CM corresponds to the "imaging unit" in the present invention. The process of the recipe corresponds to the "step" in the present invention. The step S2 corresponds to the "processing step" in the present invention. The step S4 corresponds to the "imaging step" in the present invention. The steps S5 and S6 correspond to the "abnormality detecting step" in the present invention.

6. Substrate Treating System

Figure 10:
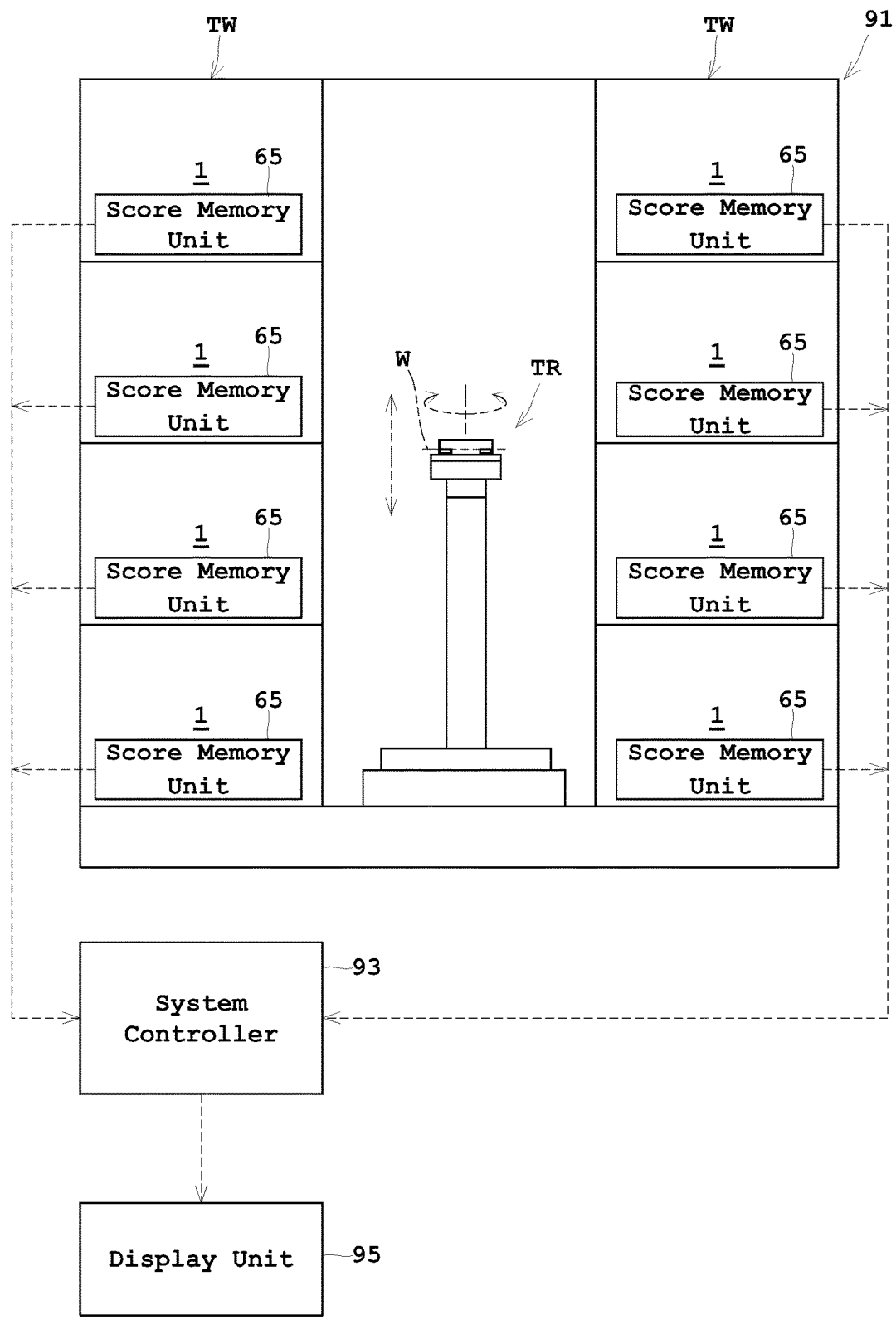
FIG. 10 is a schematic view of a substrate treating system according to the embodiment.

While the embodiment described above is a single configuration of the substrate treating apparatus 1, the present invention can also be applied to the following construction. Reference is now made to FIG. 10. FIG. 10 is a schematic view of a substrate treating system according to one embodiment.

The substrate treating system 91 includes towers TW in which four stages of the substrate treating apparatus 1 are arranged in a height direction, for example. In the substrate treating system 91, the towers TW are arranged so as to face apart from each other. In the substrate treating system 91, transport robot TR is arranged between the towers TW. The transport robot TR is configured so as to move upward and downward freely in the height direction. The transport robot TR is configured so as to advance and withdraw an arm, not shown, to and from the substrate treating apparatus 1 freely. The transport robot TR delivers a substrate W among the substrate treating apparatus 1.

The substrate treating system 91 further includes a system controller 93, and a display unit 95. The system controller 93 controls en bloc the substrate treating apparatus 1 and the transport robot TR. The system controller 93 can access the score memory unit 65 of the substrate treating apparatus 1. The system controller 93 displays a score of the score memory unit 65 on the display unit 95. The score is displayed on every substrate treating apparatus 1.

This can easily help understanding of a difference between the substrate treating apparatus 1 having the same construction. Consequently, visualizing the difference in operation can contribute to simple work upon adjustment for reduction in difference between the substrate treating apparatus 1.

Moreover, the substrate treating system 91 may include a camera CM that keeps the transport robot TR in the field of view. The substrate treating system 91 may be configured as in the recipe of the substrate treating apparatus 1 described above in such a manner that comparison is made between the normal image CI in the recipe of transportation and the real image RI and an abnormality is detected for the transport robot TR.

The present invention is not limited to the foregoing examples, but may be modified as follows.

(1) In the example described above, the normal image CI and the real image RI are each a static image. However, the present invention is not limitative to this. That is, the normal image CI and the real image RI may each be a video image. These video images may have the same frame rate and the timing to check described above may be set for each frame. This can easily detect an abnormality between the image before the component moves and the image after the component moves. Moreover, this yields increase in number of target areas for abnormality detection.

(2) In the embodiment described above, the normal image CI is merely an image based on the three-dimensional design information. In the present invention, reflection and shading caused by a surface shape of each component, reflection and shadows caused by a positional relationship in the casing CA and the environment may be reflected in the normal image CI, for example. This can prevent misjudgment caused by the shape, environment, and the like.

(3) In the embodiment described above, the substrate treating apparatus 1 includes one camera CM. However, the present invention does not exclude provision of a plurality of cameras CM. For example, a plurality of cameras CM like a camera CM dedicated to the nozzle 33 and a camera CM dedicated to the chuck 9 may be provided. This can improve a detection accuracy of abnormalities, especially in the case of a small component like the chuck 9, for example. In this case, the real image by the camera CM may correspond to the normal image from the view point of the camera CM.

(4) In the example described above, an abnormality about movement of the nozzle 33 and ejection of the treatment liquid from the fixed nozzle RN can be detected. However, the present invention is not limitative to this. In the present invention, such an abnormality about movement of the guard 23, ejection of the treatment liquid from the nozzle 33, and operation of the chucks 9 can be detected, for example.

(5) In the example described above, the substrate treating apparatus 1 causes the abnormality detecting unit 63 to calculate the score in accordance with the difference of the abnormality, and causes the score memory unit 65 to store the score. However, such a construction is not essential in the present invention. This case can suppress a load of the abnormality detecting unit 63, leading to a simplified construction.

(6) In the example described above, the fixed nozzle RN is provided and the normal image contains the image by the fluid simulator. However, such a configuration is not essential in the present invention. Although the region of interest ROI is located at one position in the example described above, a plurality of positions may be provided. For example, when two positions, i.e., a region immediately after the treatment liquid is ejected from the ejection port of the fixed nozzle RN and a region immediately before the treatment liquid drops on the rotation center P1, are provided, an abnormality in the treatment liquid supplying unit SU can be detected more accurately. Moreover, the region of interest ROI may be provided not only to the fixed nozzle RN but also to the treatment liquid ejected from the nozzle 33, for example.

(7) In the embodiment described above, the substrate treating apparatus 1 has been described as one example that performs treatment to the substrate W with the treatment liquid. However, the present invention is not limitative to such a construction of the substrate treating apparatus. For example, the present invention is also applicable to a device for heat-treating the substrate W, a device for transporting the substrate W, or a device for exposing the substrate W. Moreover, the present invention is not limited to a single-wafer processing apparatus for treating substrates W one by one as described in the above embodiment. In other words, the present invention is also applicable to a batch-type device for treating a plurality of substrates simultaneously.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for performing a predetermined treatment on a substrate, the apparatus comprising:
a recipe memory unit configured to store a recipe, specifying operation details and an execution order of a component that forms the substrate treating apparatus, to perform the predetermined treatment;
an imaging unit provided at a predetermined location and configured to image the component as a real image at work;
a normal image memory unit configured to simulate a condition in advance where the component normally operates in response to the recipe and store in advance a normal image at this time in a view from the location in accordance with three-dimensional design information of the substrate treating apparatus;
an operation controller configured to control the component in response to the recipe to perform the predetermined treatment; and
an abnormality detecting unit configured to detect an abnormality in accordance with a difference between the normal image synchronized with operation of the recipe and the real image at work when the operation controller actually treats the substrate in response to the recipe.

2. The substrate treating apparatus according to claim 1, wherein
the imaging unit captures the real image as a video image, and
the normal image memory unit stores the normal image as a video image.

3. The substrate treating apparatus according to claim 1, wherein
the abnormality detecting unit performs synchronization with reference to an arbitrary step among a plurality of steps constituting the recipe.

4. The substrate treating apparatus according to claim 2, wherein
the abnormality detecting unit performs synchronization with reference to an arbitrary step among a plurality of steps constituting the recipe.

5. The substrate treating apparatus according to claim 1, further comprising:
a spin chuck configured to support a substrate in a horizontal posture and rotate the substrate;
a nozzle configured to eject a treatment liquid from its distal end to the substrate supported by the spin chuck; and
a nozzle moving mechanism configured to move the distal end of the nozzle between an origin position laterally apart from the substrate and an ejecting position above the substrate, wherein
the abnormality detecting unit detects an abnormality about movement of the nozzle.

6. The substrate treating apparatus according to claim 2, further comprising:
a spin chuck configured to support a substrate in a horizontal posture and rotate the substrate;
a nozzle configured to eject a treatment liquid from its distal end to the substrate supported by the spin chuck; and
a nozzle moving mechanism configured to move the distal end of the nozzle between an origin position laterally apart from the substrate and an ejecting position above the substrate, wherein
the abnormality detecting unit detects an abnormality about movement of the nozzle.

7. The substrate treating apparatus according to claim 3, further comprising:
a spin chuck configured to support a substrate in a horizontal posture and rotate the substrate;
a nozzle configured to eject a treatment liquid from its distal end to the substrate supported by the spin chuck; and
a nozzle moving mechanism configured to move the distal end of the nozzle between an origin position laterally apart from the substrate and an ejecting position above the substrate, wherein
the abnormality detecting unit detects an abnormality about movement of the nozzle.

8. The substrate treating apparatus according to claim 4, further comprising:
a spin chuck configured to support a substrate in a horizontal posture and rotate the substrate;
a nozzle configured to eject a treatment liquid from its distal end to the substrate supported by the spin chuck; and
a nozzle moving mechanism configured to move the distal end of the nozzle between an origin position laterally apart from the substrate and an ejecting position above the substrate, wherein
the abnormality detecting unit detects an abnormality about movement of the nozzle.

9. The substrate treating apparatus according to claim 1, further comprising:
a spin chuck configured to support a substrate in a horizontal posture and rotate the substrate; and
a fixed nozzle whose arrangement is fixed and configured to eject a treatment liquid from its distal end to the substrate supported by the spin chuck, wherein
the normal image memory unit includes, as the normal image, an image obtained by simulating a normal ejection condition of the treatment liquid from the fixed nozzle in view of the location by a fluid simulator.

10. The substrate treating apparatus according to claim 2, further comprising:
a spin chuck configured to support a substrate in a horizontal posture and rotate the substrate; and
a fixed nozzle whose arrangement is fixed and configured to eject a treatment liquid from its distal end to the substrate supported by the spin chuck, wherein
the normal image memory unit includes, as the normal image, an image obtained by simulating a normal ejection condition of the treatment liquid from the fixed nozzle in view of the location by a fluid simulator.

11. The substrate treating apparatus according to claim 3, further comprising:
a spin chuck configured to support a substrate in a horizontal posture and rotate the substrate; and
a fixed nozzle whose arrangement is fixed and configured to eject a treatment liquid from its distal end to the substrate supported by the spin chuck, wherein
the normal image memory unit includes, as the normal image, an image obtained by simulating a normal ejection condition of the treatment liquid from the fixed nozzle in view of the location by a fluid simulator.

12. The substrate treating apparatus according to claim 4, further comprising:
a spin chuck configured to support a substrate in a horizontal posture and rotate the substrate; and
a fixed nozzle whose arrangement is fixed and configured to eject a treatment liquid from its distal end to the substrate supported by the spin chuck, wherein
the normal image memory unit includes, as the normal image, an image obtained by simulating a normal ejection condition of the treatment liquid from the fixed nozzle in view of the location by a fluid simulator.

13. A substrate treating system comprising a plurality of substrate treating apparatus according to claim 1.

14. The substrate treating system according to claim 13, wherein the substrate treating apparatus each include:
- a score memory unit configured to store a score in accordance with the difference detected by the abnormality detecting unit, and the substrate treating apparatus further include:
- a system controller configured to read out a score of the score memory unit; and
- a display unit configured to display the score read out by the system controller.

15. A substrate treating method for performing a predetermined treatment on a substrate, the method comprising:
- a processing step of bringing a substrate treating apparatus, provided with an imaging unit at a predetermined location, into at work and controlling a component forming the substrate treating apparatus in response to a recipe, specifying operation details and an execution order of the component forming the substrate treating apparatus, to perform the predetermined treatment;
- an imaging step of capturing an image of the component, forming the substrate treating apparatus, as a real image by the imaging unit in the processing step; and
- an abnormality detecting step of detecting an abnormality in accordance with a difference between a normal image synchronized with operation of the recipe and a real image stored in a view from the location when a condition is simulated in advance where the component normally operates in response to the recipe in accordance with three-dimensional design information of the substrate treating apparatus, the normal image being.

* * * * *